(12) United States Patent
Ross et al.

(10) Patent No.: US 6,710,255 B2
(45) Date of Patent: Mar. 23, 2004

(54) PRINTED CIRCUIT BOARD HAVING BURIED INTERSIGNAL CAPACITANCE AND METHOD OF MAKING

(75) Inventors: Jason Ross, Folsom, CA (US); Timothy J. Maloney, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 135 days.

(21) Appl. No.: 09/822,715

(22) Filed: Mar. 30, 2001

(65) Prior Publication Data

US 2002/0139568 A1 Oct. 3, 2002

(51) Int. Cl.$^7$ .................................................. H05K 1/03
(52) U.S. Cl. ...................... 174/255; 361/780; 361/306.3; 361/313; 333/12; 333/246; 333/238
(58) Field of Search .............................. 361/763, 765, 361/766, 777, 780, 782, 794, 303, 301.4, 306.1, 313, 306.3, 321.2; 174/255, 262–266; 333/12, 238, 246

(56) References Cited

U.S. PATENT DOCUMENTS

| | | | | |
|---|---|---|---|---|
| 4,551,789 A | * | 11/1985 | Schettler et al. | 361/774 |
| 5,326,284 A | * | 7/1994 | Bohbot et al. | 439/607 |
| 5,466,892 A | * | 11/1995 | Howard et al. | 174/250 |
| 5,475,262 A | * | 12/1995 | Wang et al. | 257/523 |
| 5,657,208 A | * | 8/1997 | Noe et al. | 361/760 |
| 5,663,870 A | * | 9/1997 | Kerndlmaier | 361/763 |
| 5,729,438 A | * | 3/1998 | Pieper et al. | 361/760 |
| 5,912,809 A | | 6/1999 | Steigerwald et al. | |
| 5,929,729 A | * | 7/1999 | Swarup | 333/246 |
| 5,962,815 A | | 10/1999 | Lan et al. | |
| 6,004,657 A | * | 12/1999 | Moriyasu et al. | 428/210 |
| 6,096,980 A | * | 8/2000 | Ferry | 174/261 |
| 6,115,264 A | * | 9/2000 | Nosaka | 333/172 |
| 6,175,088 B1 | * | 1/2001 | Saccocio | 174/262 |
| 6,388,207 B1 | * | 5/2002 | Figueroa et al. | 174/261 |
| 6,407,929 B1 | * | 6/2002 | Hale et al. | 361/763 |

OTHER PUBLICATIONS

"Accurate Design of Microstrip Directional Couplers with Capacitive Compensation," by Michael Dydyk, 1990 IEEE Digest, pp. 581–584.

* cited by examiner

Primary Examiner—Kamand Cuneo
Assistant Examiner—Jose H. Alcala
(74) Attorney, Agent, or Firm—Blakely, Sokoloff, Taylor & Zafman LLP

(57) ABSTRACT

A first signal path is connected to a first plane via a plated hole. A first metal flood is connected to the plated hole to form a first plate. A second signal path is on a second plane. A second metal flood connected to the second signal path to form a second plate above the first plate.

22 Claims, 5 Drawing Sheets

PARALLEL PLATE CAPACITOR
(PRIOR ART)

PRINTED CIRCUIT BOARD HAVING BURIED INTERSIGNAL CAPACITANCE AND METHOD OF MAKING

BACKGROUND

1. Field of the Invention

This invention relates to printed circuit board (PCB) design. In particular, the invention relates to capacitance fabricated in the printed circuit board.

2. Description of Related Art

Mode compensation is one known signal quality technique in microwave PCB design. It is used to compensate for the different odd and even mode wave velocities through microstrip, where fields through air and dielectric cause the odd mode to be faster. The microwave application is for essentially analog signals and allows, for example, near-ideal directional couplers to be fabricated. In the present work, the mode compensation is used to help minimize the upward glitch seen on system memory data lines (i.e., when one or more lines are held low and the other data lines switch from low to high).

Mode compensation requires placing capacitance between adjacent signal traces, usually at the driver or receiver end of the trace. One way to implement mode compensation using the existing technology is to place discrete capacitors on the PCB, with highest priority to the receiver end of the signal traces. This method, however, is difficult and expensive. Placing discrete capacitors at the receiver end requires adding many discrete components, which add to the bill-of-materials (BOM) cost of the PCB. Furthermore, laying out a PCB to add sites to place these discrete capacitors is difficult because at the receiver, signal traces are often spaced 5 milli-inches (mils) apart while the most common capacitor size used in this application is 30 mils wide. Finally, placing discrete capacitors to implement mode compensation violates design-for-manufacturing (DFM) rules pertaining to component-to-component spacing, which leads to higher assembly fallout and more expensive finished PCBs.

BRIEF DESCRIPTION OF THE DRAWINGS

The features and advantages of the present invention will become apparent from the following detailed description of the present invention in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

Figure 1:
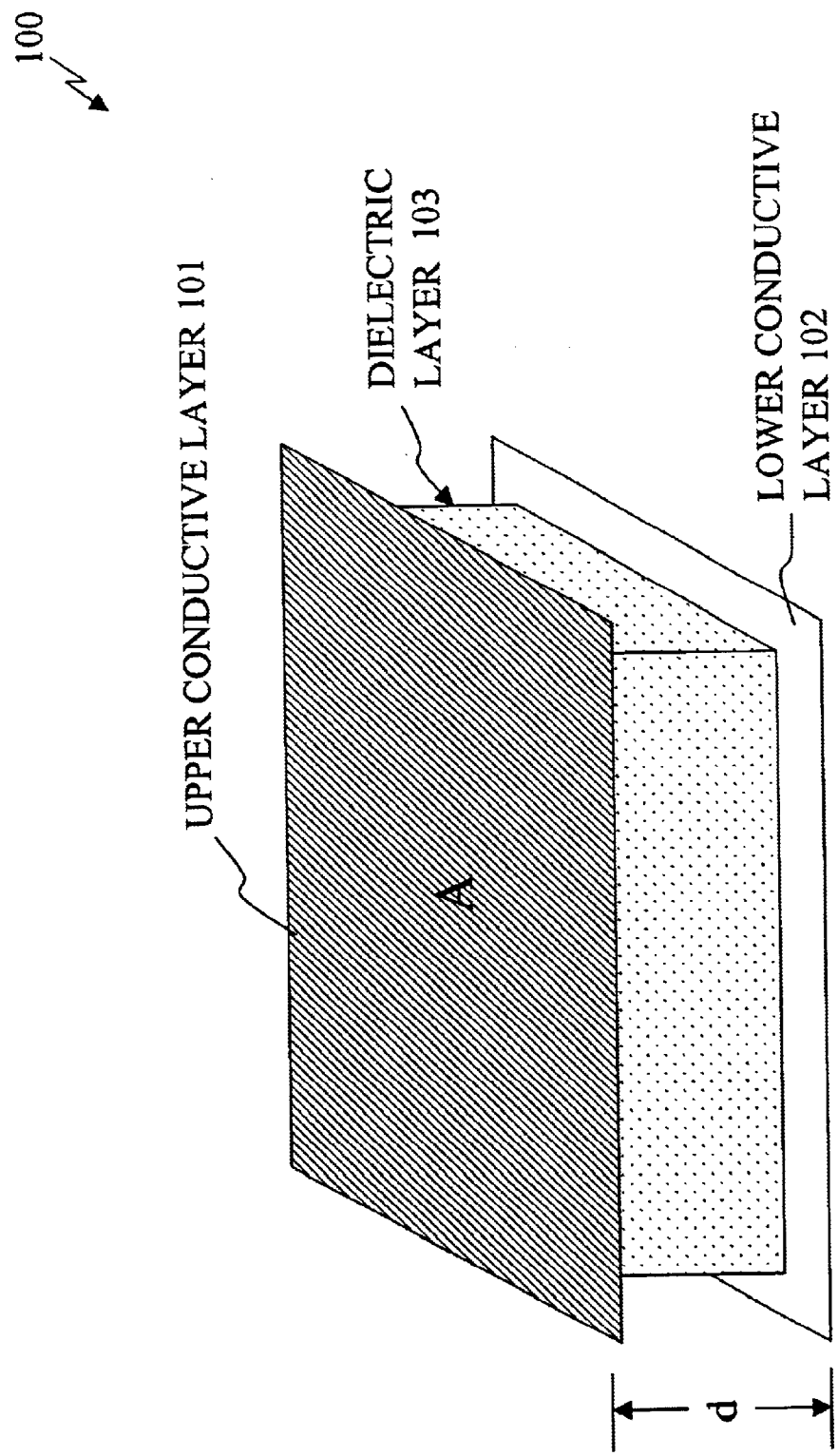
FIG. 1 is a diagram illustrating a parallel plate capacitor in which one embodiment of the invention can be practiced.

FIG. 1 is a diagram illustrating a parallel plate capacitor 100 in which one embodiment of the invention can be practiced.

The parallel plate capacitor 100 includes upper and lower plates, which form upper conductive layer 101 and lower conductive layer 102, respectively. The upper and lower conductive layers 101 and 102 are separated by a dielectric layer 103. The dielectric layer 103 may be formed of materials such as a photoimagable polyimide and epoxy resin. The dielectric layer 103 has a plurality of via holes (not shown), which extend from the conductive layer 101 to the conductive layer 102. The via holes are most commonly drilled and plated with metal, but could be fabricated in a variety of ways. The via holes serve to electrically connect conductive paths on different conductive layers of the PCB.

A parallel-plate capacitor is formed when the upper and lower conductive layers 101 and 102 are displaced with a particular proximity to one another such that the voltage difference between the plates is proportional to the difference in the charges on each plate. The capacitance of the parallel-plate capacitor 100 is a function of the area (A) of the plates formed on the upper and lower conductive layers 101 and 102, the distance (d) between the two conductive layers, and the permittivity ($\epsilon$) of the dielectric layer separating the two conductive layers. In particular, the mutual capacitance (C) is given by the following equation:

$$C = \epsilon A/d$$

In other words, the capacitance size is controlled by varying the distance between the two conductive layers 101 and 102 and/or the area of the plates on conductive layer 101 and/or conductive layer 102.

Figure 2A:
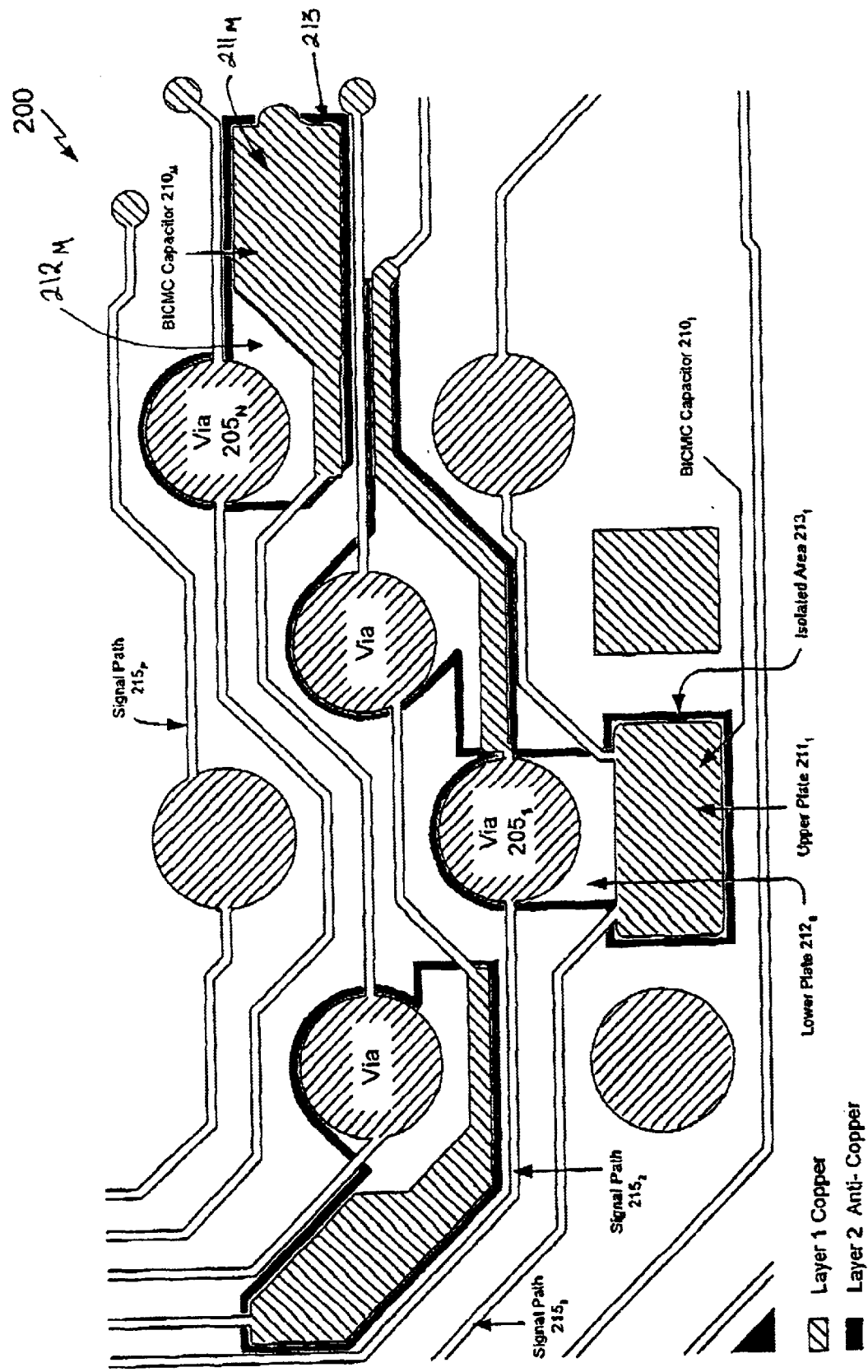
FIG. 2A is a diagram illustrating a computer-aided design (CAD) of buried intersignal capacitance mode compensation (BICMC) on a PCB according to one embodiment of the invention.
Figure 2B:
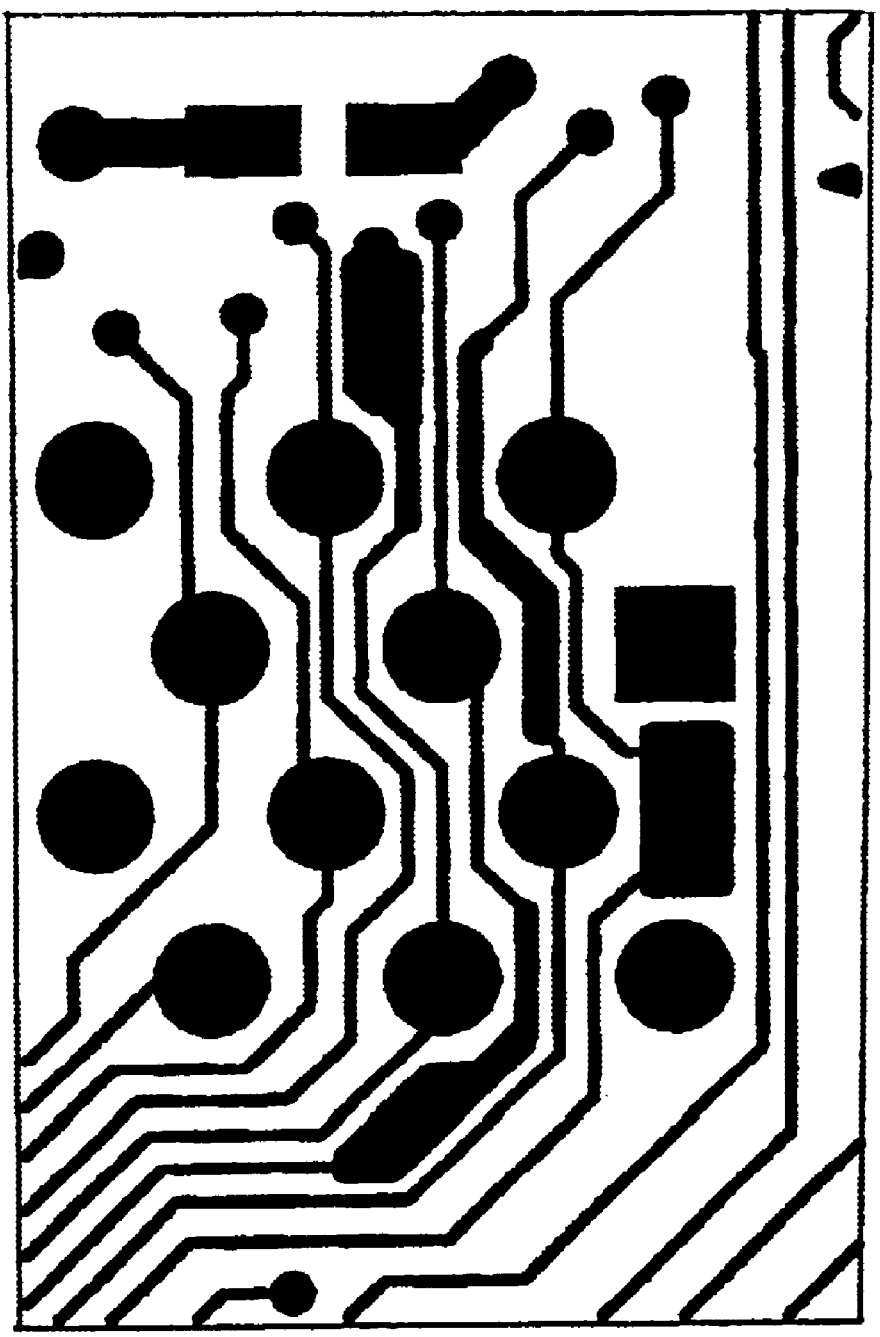
FIG. 2B is a diagram illustrating a CAD of a first layer of the PCB shown in FIG. 2A.
Figure 2C:
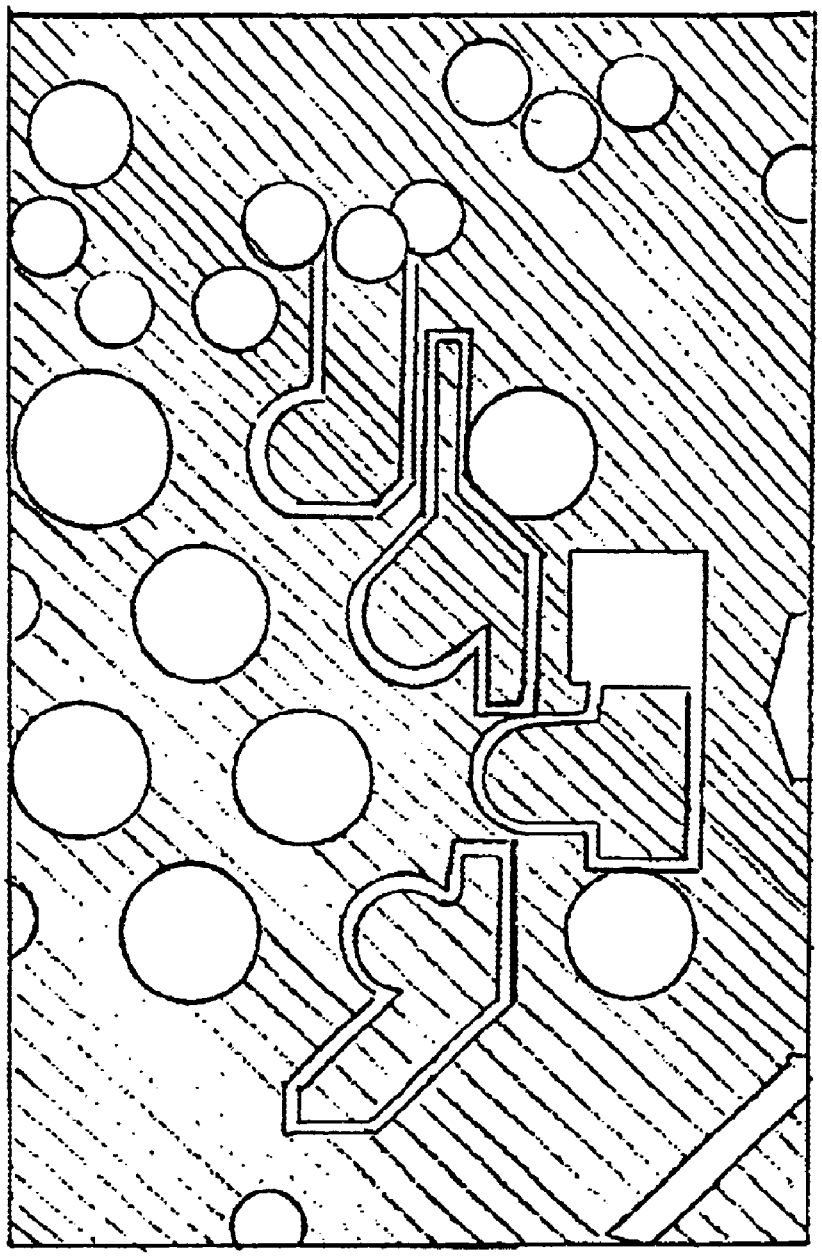
FIG. 2C is a diagram illustrating a CAD of a second layer of the PCB shown in FIG. 2A.

FIGS. 2A–2C are an illustration of a top view computer-aided design (CAD) layout of the buried intersignal capacitance mode compensation (BICMC) on a printed circuit board (PCB) 200 according to one embodiment of the invention.

The PCB 200 is used for interconnecting integrated circuit (IC) chips and other electronic components and devices. The PCB 200 is formed by a substrate that supports a plurality of insulated conductive trace layers (i.e., conductive layers 101 and 102). The insulated trace layers typically include surface (e.g., outer) conductive trace layers and embedded trace layers with selected trace layers connected as a ground plane and a power plane. Integrated circuits and electronic components and devices are mounted on an outer surface of the multiple layered printed circuit board and selectively connected to the trace layers by plated-through holes called via holes or vias. As stated earlier, a via is an electrical conductor between the multiple layers in the PCB 200. The via may be made by drilling a via hole through the layers and plating the via hole with a conductive material.

Buried Intersignal Capacitance (BIC) is a method of arranging traces in a PCB that allows the board designer to create a specified amount of capacitance between signals. The BIC is fonned by creating parallel plates on adjacent layers of a circuit board while preserving the existing circuit board structure. The BIC is used in mode compensation to improve signal quality in the PCB. One of the effective placements of the mode compensating capacitor is between adjacent signal traces at the receiver end of the trace. Placing the mode compensation capacitor at the driver end of the two adjacent signal traces is an alternative way to improve signal quality in the PCB. Mode compensation counteracts the tendency of odd-mode crosstalk to travel faster than even-mode crosstalk through a microstrip transmission line. Even-mode crosstalk occurs when a signal line changes its; level in one direction and an adjacent signal line changes its level in the same direction (i.e., the signal line is changed from low to high and the adjacent signal line is also changed from low to high). Odd-mode crosstalk occurs when a signal line changes its level in one direction and the adjacent signal line changes its level in the opposite direction (i.e., the signal line is changed from low to high and the adjacent signal line is changed from high to low).

The electric field associated with odd-mode crosstalk exists mostly in the air as it propagates down the microstrip transmission line. The electric field associated with even-mode crosstalk exists mostly in the insulating dielectric layer of the PCB as it propagates down the microstrip transmission line. Electric fields propagate faster through air than through the insulating dielectric layer of the PCB. This causes the difference in flight times between odd-mode and even-mode crosstalk, and can lead to signal quality issues at the receiver, especially from the time that odd-mode crosstalk arrives at the receiver end of a transmission line to the (later) time that even-mode crosstalk arrives at the receiver end of the transmission line. The function of the capacitance between the two adjacent signal lines is to match the speed of the odd-mode to that of the even-mode. This greatly influences the unwanted crosstalk being transmitted down the signal lines, and also equalizes the arrival time of various data patterns representing even and odd modes. It is contemplated that the coupling of the capacitance between the two adjacent signal lines may also be used for other applications such as to reduce jitter in a system clock.

In one embodiment, the PCB 200 includes multiple conductive layers (i.e., routing layers) and multiple intermediate dielectric layers (not shown). The multiple conductive layers include plurality signal planes, ground (GND) planes, and power (VCC) planes. The multiple conductive layers are separated by the multiple intermediate dielectric layers (i.e., dielectric layer 103). The multiple conductive layers are interconnected by a plurality of vias $205_1$ to $205_N$, including connections to the power planes and connections to the ground planes, so that signal and power currents are transferred between the planes. The multiple conductor layers also contain metal floods that form plurality of upper and lower plates $211_1$ to $211_M$ and $212_1$ to $212_M$, respectively, that form a plurality of BICMC capacitors $210_1$ to $210_M$ (where M is a positive integer). It is noted that in one embodiment, the metal flood may be made of copper.

The signal planes lie within the multiple conductive layers. The signal planes include a plurality of signal paths (i.e., traces) $215_1$ to $215_P$ (where P is a positive integer) for conducting signals between integrated circuit chips. The ground planes or the power planes also lie within the multiple conductive layers. These planes provide power supply to circuits connected to the multiple layers PCB structure and that current may be channeled from the power planes through the vias $205_1$ to $205_N$ to supply power to the integrated circuit chips.

Metal floods such as copper, aluminum, gold, silver, lead/tin (solder), molybdenum and others may also be formed in the power planes in a plurality of isolated areas that form the plurality of lower plates $212_1$ to $212_M$. These lower plates are part of the parallel plates that form the plurality of capacitors $210_1$ to $210_M$. Individual isolated areas $213_1$ to $213_M$ are created around the plated holes or vias $205_1$ to $205_M$. The individual isolated areas are designed so that the lower plates and the upper plates in the signal plane form the parallel plates that make up the plurality of capacitors $210_1$ to $210_M$.

The signal paths $215_1$ to $215_P$ within the signal planes are connected to the metal flood $211_1$ to $211_M$ within the same planes. Other signal paths within the signal planes are connected to the other planes in other layers by vias $205_1$ to $205_N$. The other layers may be layers that contain ground planes and/or power planes. The signal, ground, and power planes may be on the outer surface layers or the inner layers.

In one embodiment, an outer or surface layer 255 and an inner layer (not shown) are separated by a dielectric layer. The inner layer contains a power plane that is mostly flooded with copper since it is a power delivery layer. The flooded copper areas are divided into plurality of isolated smaller areas $213_1$ to $213_M$ (shown in hatched since they are embedded beneath the surface layer 255), which are used to form a plurality of lower plates of the capacitors $210_1$ to $210_M$. The surface layer 255 contains a signal plane that has the plurality of signal paths $215_1$ to $215_P$. Each of the signal paths $215_1$ to $215_P$ has a corresponding receiver end and a driver end. For example, a signal path $215_2$ from the signal plane, embedded in the surface layer 255, interconnects with the power plane, embedded in the inner layer, by a via $205_1$. The via $205_1$ is located inside the isolated area $213_1$ (shown in hatched) that is formed in the power plane to create lower plate $212_1$, one of the two parallel plates of the capacitor $210_1$. The signal path $215_1$, which is adjacent to the signal path $215_2$, is connected to the copper flood on the signal plane to form the upper plate of the parallel plates. The signal path $215_2$ is connected the adjacent plane (i.e., power plane) through the via $205_1$. The capacitor $210_1$ is formed between the two plates $211_1$ and $212_1$, and thus between the two signal paths $215_1$ and $215_2$. The signal paths $215_1$ to $215_P$ may be adjacent to one another on the same signal plane or may be adjacent to one another on two different planes (i.e., the signal and power planes).

In one embodiment, capacitance is placed between adjacent signal paths at the receiver end of the signal paths in mode compensation. In other embodiments, the capacitance may be placed at different locations along the signal paths (i.e., the driver ends). The placing of capacitance between adjacent signal paths compensates for the different odd and even mode wave velocities through a microstrip. As stated earlier, the mode compensation is used, in one embodiment, to help minimize the upward glitch seen on data lines in a system when one or more lines are held low and other data lines switch from low to high.

Figure 3:
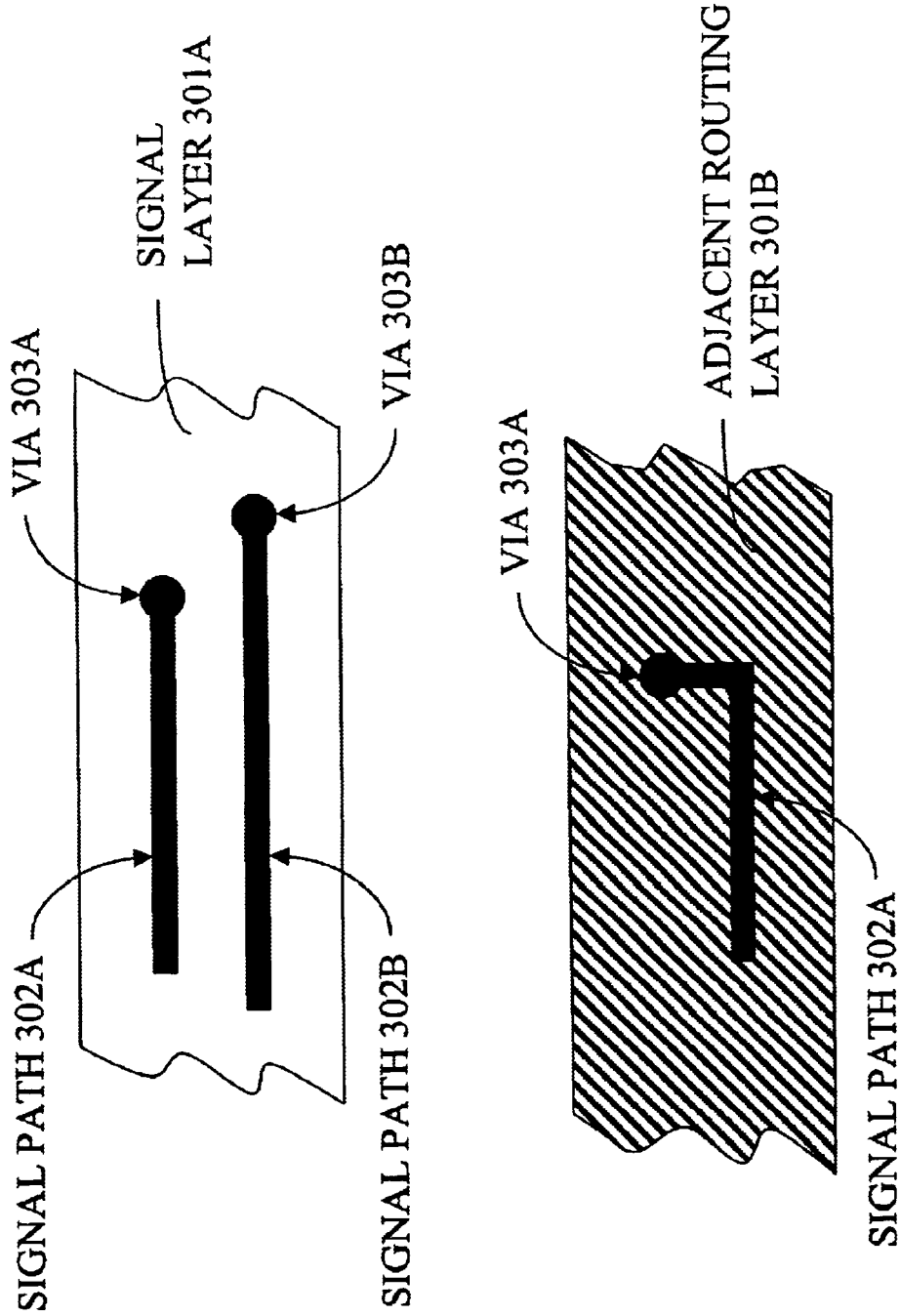
FIG. 3 is a diagram of a partial view of signal paths in two adjacent conductive signal layers of a PCB, illustrating an embodiment of the invention.

FIG. 3 is a diagram illustrating a partial view of a signal path in one signal layer and a partial view of the next plane layer adjacent to the signal layer of the PCB 200 according to one embodiment of the invention.

A signal layer 301A includes signal paths 302A and 302B having vias 303A and 303B, respectively. The signal paths 302A and 302B carry signals between devices on the POB 200. The two signal paths 302A and 302B may be horizontally adjacent to one another and on the same plane (i.e., signal plane) or may be vertically adjacent to one another on two different but adjacent planes. The via 303A as shown on the signal layer 301A is used to interconnect signal path 302A on the signal layer 301 A to the signal path 302A on the next layer 301B. In other words, the signal path 302A extends down from the via 303A to beneath the signal path 302B, turns, and follows parallel to the signal path 302B.

A buried interconnect capacitance (as discussed in reference to FIGS. 2A–2C) is created between the signal path 302B of the signal layer 301A and the signal path 302A of the next layer 301B. These two paths run immediately above/below each other and are separated by a dielectric layers. The size of the capacitance can be controlled by adjusting the distance between the signal path 302B on signal layer 301A and the signal path 302 on the adjacent routing layer 301B.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising: a dielectric material having a first plane and a second plane opposite the first plane;
    a first signal path connected to said first plane, via a plurality of plated holes formed through the dielectric material at different locations along said first signal path, the first signal path on said second plane;
    a first plurality of metal floods connected to the respective plated holes to form a plurality of first plates, the first metal floods on the first plane;
    a second signal path on the second plane; and
    a second plurality of metal floods connected to the second signal path to form a plurality of second plates above the respective first plates, the second plate on the second plane.

2. The apparatus of claim 1 wherein each pair of first and second plates forms a capacitance.

3. The apparatus of claim 1 wherein the first and second signal paths are adjacent to each other.

4. The apparatus of claim 1 wherein the first plane is a ground plane or a power plane.

5. The apparatus of claim 4 wherein each one of the first metal floods is an isolated area in the first plane.

6. A method comprising:
    providing a first dielectric material having a first plane, and a second plane opposite the first plane;
    connecting a first signal path to said first plane via a plurality of plated holes formed through the first dielectric material at different locations along said first signal path, the first signal path on said second plane;
    forming a plurality of first plates by connecting a plurality of first metal floods to the respective plated holes, the first metal floods on the first plane; and
    connecting a plurality of second metal flood to a second signal path on the second plane to form a plurality of second plates above the respective first plates.

7. The method of claim 6 wherein each pair of first and second plate forms a capacitance.

8. The method of claim 6 wherein the first and second signal paths are adjacent to each other.

9. The method of claim 6 wherein the first plane is a ground plane or a power plane.

10. The method of claim 9 wherein each one of the first metal floods is an isolated area in the first plane.

11. The apparatus of claim 2 further comprising a second dielectric material disposed on said first plane of said first dielectric material, and a third dielectric material disposed on said second plane of said dielectric material, wherein the capacitance is a buried intersignal capacitance.

12. The method of claim 7 forming a second dielectric material on said first plane of said first dielectric material, and forming a third dielectric material on said second plane of said first dielectric material, wherein the capacitance is a buried intersignal capacitance.

13. An apparatus comprising:
    a printed circuit board;
    a first transmission line on a first layer of the printed circuit board;
    a second transmission line on the first layer of the printed circuit board; and
    a plurality of capacitors connected to the first transmission line and the second transmission line at different locations, each of the capacitors comprising:
        a first plate connected to the first transmission line by a plated hole, the first plate on a second layer of the printed circuit board;
        a second plate connected to the second transmission line, the second plate on the first layer of the printed circuit board; and
        a dielectric layer between the first plate and the second plate, the dielectric layer between the first layer of the printed circuit board and the second layer of the printed circuit board.

14. The apparatus of claim 13 wherein the first plate is above the second plate.

15. The apparatus of claim 13 wherein the second plate is above the first plate.

16. The apparatus of claim 13 wherein the capacitor is a buried intersiganl capacitor.

17. The apparatus of claim 16 wherein the buried intersignal capacitor mode compensates to improve signal quality in the printed circuit board.

18. The apparatus of claim 17 wherein the buried intersignal capacitor matches the propagation speed of odd-mode switch signals with the propagation speed of even-mode switch signals.

19. The apparatus of claim 13 wherein the first transmission line is adjacent to the second transmission line.

20. The apparatus of claim 13 wherein the first transmission line is inductively coupled to the second transmission line.

21. The apparatus of claim 13 wherein the first transmission line and/or second transmission line are routed as microstrips.

22. The apparatus of claim 13 wherein first transmission line and the second transmission line are routed on surface layers of the printed circuit board.

* * * * *

UNITED STATES PATENT AND TRADEMARK OFFICE
CERTIFICATE OF CORRECTION

PATENT NO. : 6,710,255 B2  
DATED : March 23, 2004  
INVENTOR(S) : Ross et al.

It is certified that error appears in the above-identified patent and that said Letters Patent is hereby corrected as shown below:

Column 2,
Line 64, delete "fonned", insert -- formed --.

Column 4,
Line 60, delete "POB", insert -- PCB --.

Signed and Sealed this

Twenty-sixth Day of October, 2004

JON W. DUDAS
*Director of the United States Patent and Trademark Office*